(12) United States Patent
Blanchard et al.

(10) Patent No.: US 11,557,496 B2
(45) Date of Patent: Jan. 17, 2023

(54) LOAD LOCK WITH INTEGRATED FEATURES

(71) Applicant: Applied Materials, Inc., Santa Clara, CA (US)

(72) Inventors: Michael Blanchard, Gloucester, MA (US); Steven M. Anella, West Newbury, MA (US); Brant S. Binns, Beverly, MA (US); Jordan B. Tye, Arlington, MA (US); D. Jeffrey Lischer, Acton, MA (US)

(73) Assignee: Applied Materials, Inc., Santa Clara, CA (US)

( * ) Notice: Subject to any disclaimer, the term of this patent is extended or adjusted under 35 U.S.C. 154(b) by 327 days.

(21) Appl. No.: 16/826,970

(22) Filed: Mar. 23, 2020

(65) Prior Publication Data

US 2021/0296146 A1 Sep. 23, 2021

(51) Int. Cl.
*H01L 21/67* (2006.01)
*H01L 21/677* (2006.01)
*H01L 21/673* (2006.01)

(52) U.S. Cl.
CPC .... *H01L 21/67248* (2013.01); *H01L 21/6732* (2013.01); *H01L 21/6773* (2013.01); *H01L 21/67109* (2013.01); *H01L 21/67706* (2013.01)

(58) Field of Classification Search
CPC ......... H01L 21/67248; H01L 21/67109; H01L 21/6732; H01L 21/67706; H01L 21/6773; H01L 21/67201
See application file for complete search history.

(56) References Cited

U.S. PATENT DOCUMENTS

| 9,378,994 | B2 * | 6/2016 | Weaver | H01L 21/67201 |
| 11,127,616 | B2 * | 9/2021 | Ueno | H01L 21/67201 |
| 2001/0024609 | A1 * | 9/2001 | White | B65G 49/061 |
| | | | | 414/217 |
| 2010/0040437 | A1 * | 2/2010 | Iwabuchi | C23C 16/4586 |
| | | | | 414/217 |

(Continued)

FOREIGN PATENT DOCUMENTS

| CN | 102246290 A | 11/2011 |
| JP | 9-260459 A | 10/1997 |

(Continued)

OTHER PUBLICATIONS

International Search Report and Written Opinion dated Jul. 12, 2021 in corresponding PCT application No. PCT/US2021/021860.

*Primary Examiner* — Mohammed Shamsuzzaman
(74) *Attorney, Agent, or Firm* — Nields, Lemack & Frame, LLC

(57) ABSTRACT

A cassette with embedded temperature sensors that is disposed within a load lock is disclosed. The temperature sensors may be disposed in a plurality of shelves of the load lock cassette to monitor the temperature of each of a plurality of workpieces disposed in the load lock. The output of these temperature sensors may be provided to a controller, which controls when the load lock is opened. The load lock cassette may also include cooling channels to accelerate the cooling of the workpieces to improve throughput. The cooling may be controlled using closed loop control, where a controller monitors the temperature of the workpieces during the cooling operation.

15 Claims, 9 Drawing Sheets

(56) References Cited

U.S. PATENT DOCUMENTS

| | | |
|---|---|---|
| 2010/0326637 A1 | 12/2010 | Sasaki et al. |
| 2011/0290185 A1* | 12/2011 | Ihara ................. H01L 21/67109 |
| | | 118/724 |
| 2012/0170999 A1* | 7/2012 | Sakaue ............. H01L 21/67739 |
| | | 414/217 |
| 2016/0284578 A1 | 9/2016 | Weaver et al. |
| 2019/0198368 A1 | 6/2019 | Weaver et al. |

FOREIGN PATENT DOCUMENTS

| | | | | |
|---|---|---|---|---|
| KR | 10-1630804 B1 | 6/2016 | | |
| TW | 200941622 A | 10/2009 | | |
| WO | WO-2014143662 A1 * | 9/2014 | .......... | B25J 11/0095 |

\* cited by examiner

LOAD LOCK WITH INTEGRATED FEATURES

FIELD

Embodiments of the present disclosure relate to a load lock, and more particularly, to a load lock that includes integrated features, such as temperature sensors and cooling channels.

BACKGROUND

Load locks are used to transfer a material from a first environment to a second environment, where the pressure within the first environment differs from that in the second environment. Often, a load lock is used to interface a high vacuum environment with an atmospheric environment. When transitioning from the atmospheric environment, the load lock opens to accept the material. Once the load lock closed, the air is exhausted from the sealed chamber. The load lock then opens to allow the material to be removed in the high vacuum environment. When transitioning from the high vacuum environment, the load lock introduces air to return the chamber to atmospheric pressure before opening.

In certain embodiments, workpieces may be processed in the high vacuum environment at an elevated temperature and placed in the load lock after processing. The workpieces are then allowed to cool and are returned to the atmospheric environment. However, there is currently no method to directly measure the temperature of individual workpieces in the load lock and provide closed loop control of the cooling of those workpieces. Thus, the workpieces are cooled using an open loop method for a predetermined amount of time. Consequently, there is no way to know when the workpieces have cooled below a certain threshold temperature, below which it is permissible to open the load lock and remove the workpieces.

This may present issues. If the predetermined amount of time is too long, the process efficiency is reduced, as the workpieces could have been removed earlier. Conversely, if the predetermined time is too short, the workpieces will be at an unacceptable high temperature. This may cause a safety hazard, such as burns to the operators handling these workpieces. Further, the containers used to hold and transport these workpieces may not be able to withstand these elevated temperatures.

Therefore, a load lock that is able to monitor the temperature of individual workpieces disposed therein would be beneficial. Further, it would be advantageous if the load lock was also able to control the cooling process.

SUMMARY

A cassette with embedded temperature sensors that is disposed within a load lock is disclosed. The temperature sensors may be disposed in a plurality of shelves of the load lock cassette to monitor the temperature of each of a plurality of workpieces disposed in the load lock. The output of these temperature sensors may be provided to a controller, which controls when the load lock is opened. The load lock cassette may also include cooling channels to control the cooling of the workpieces, such as by using data from the temperature sensors, to improve the process. The cooling may be controlled using closed loop control, where a controller monitors the temperature of the workpieces during the cooling operation.

According to one embodiment, a load lock cassette is disclosed. The load lock cassette comprises a bottom wall having a first end and a second end; a top wall; at least one post extending upward from the first end and at least one post extending upward from the second end of the bottom wall to the top wall, wherein each post comprises a plurality of shelves, each adapted to support a portion of a workpiece; and wherein one of the at least one post is a sensor post, wherein the sensor post comprises a plurality of sensor shelves, wherein each sensor shelf comprises a temperature sensor, adapted to physically contact a workpiece. In certain embodiments, the load lock cassette comprises two posts extending upward from the first end of the bottom wall and two posts extending upward from the second end of the bottom wall. In some embodiments, the sensor post comprises a printed circuit backplane. In certain embodiments, each post comprises a vertical cooling channel disposed therein. In certain embodiments, the load lock cassette comprises a lower inlet cooling channel in communication with the vertical cooling channel in the post disposed at the first end of the bottom wall, wherein the lower inlet cooling channel is disposed proximate to or embedded in the bottom wall. In certain further embodiments, the load lock cassette comprises a lower outlet cooling channel in communication with the vertical cooling channel in the post disposed at the second end of the bottom wall, wherein the lower outlet cooling channel is disposed proximate to or embedded in the bottom wall. In certain further embodiments, the load lock cassette comprises an upper cooling channel in communication with each of the vertical cooling channels, wherein the upper cooling channel is disposed proximate to or embedded in the top wall. In some embodiments, the load lock cassette comprises two posts extending upward from the first end of the bottom wall and two posts extending upward from the second end of the bottom wall, and further comprising a lower inlet cooling channel in communication with a vertical cooling channel disposed in a first post disposed at the first end of the bottom wall and in communication with a vertical cooling channel disposed in a first post disposed at the second end of the bottom wall, wherein the lower inlet cooling channel is disposed proximate to or embedded in the bottom wall. In certain further embodiments, the load lock cassette comprises a lower outlet cooling channel in communication with the vertical cooling channel disposed in a second post disposed at the first end of the bottom wall and in communication with a vertical cooling channel disposed in a second post disposed at the second end of the bottom wall, wherein the lower outlet cooling channel is disposed proximate to or embedded in the bottom wall. In some further embodiments, the load lock cassette comprises a first upper cooling channel in communication with the vertical cooling channel disposed in the first post and the vertical cooling channel disposed in the second post disposed at the first end and a second upper cooling channel in communication with the vertical cooling channel disposed in the first post and the vertical cooling channel disposed in the second post disposed at the second end, wherein the first upper cooling channel and the second upper cooling channel are disposed proximate to or embedded in the top wall. In certain embodiments, the vertical cooling channels comprise opening or nozzles disposed on an interior surface to allow fluid to exit the vertical cooling channels and flow toward a workpiece.

According to another embodiment, a system is disclosed. The system comprises a load lock; a load lock cassette disposed in the load lock, the load lock cassette comprising: a bottom wall having a first end and a second end; a top wall;

and a sensor post extending upward from the first end of the bottom wall to the top wall, wherein the sensor post comprises a plurality of sensor shelves, wherein each sensor shelf comprises a temperature sensor, adapted to physically contact a workpiece; and a controller, in communication with each of the temperature sensors, wherein the controller is configured to monitor each temperature sensor. In certain embodiments, the controller opens the load lock when all of the temperature sensors indicate a temperature less than a predetermined value. In certain embodiments, the sensor shelves are made using a plastic material and are removable from the sensor post. In certain embodiments, the sensor post is made from a metal.

According to another embodiment, a system is disclosed. The system comprises a load lock; a load lock cassette disposed in the load lock, the load lock cassette comprising: a bottom wall having a first end and a second end; a top wall; and a sensor post extending upward from the first end of the bottom wall to the top wall, wherein the sensor post comprises a plurality of sensor shelves, wherein each sensor shelf comprises a temperature sensor, adapted to physically contact a workpiece; a post extending upward from the second end of the bottom wall, wherein the post comprises a plurality of shelves, wherein a workpiece is supported by a shelf and a vertically aligned sensor shelf; a controller, in communication with each of the temperature sensors, wherein the controller is configured to monitor each temperature sensor; a fluid source; and an actuator; wherein cooling channels are disposed in the sensor post and the post, and wherein the controller controls the actuator to allow a flow of fluid from the fluid source through the cooling channels. In certain embodiments, the controller uses data from the temperature sensors to control the flow of fluid through the cooling channels. In certain embodiments, the system comprises vertical cooling channels disposed in the post, wherein the fluid flows through the post. In certain embodiments, the fluid is a gas and the cooling channels comprise nozzles or openings on an interior surface of the post, such that the gas flows across a workpiece disposed on a shelf on the post.

BRIEF DESCRIPTION OF THE FIGURES

For a better understanding of the present disclosure, reference is made to the accompanying drawings, which are incorporated herein by reference and in which.

DETAILED DESCRIPTION

As described above, in certain embodiments, workpieces are processed at elevated temperatures within a high vacuum environment. These processed workpieces are then placed in a cassette that is disposed within a load lock. The workpieces are allowed to cool, the load lock is vented, and the workpieces are then removed at atmospheric pressure.

Figure 1:
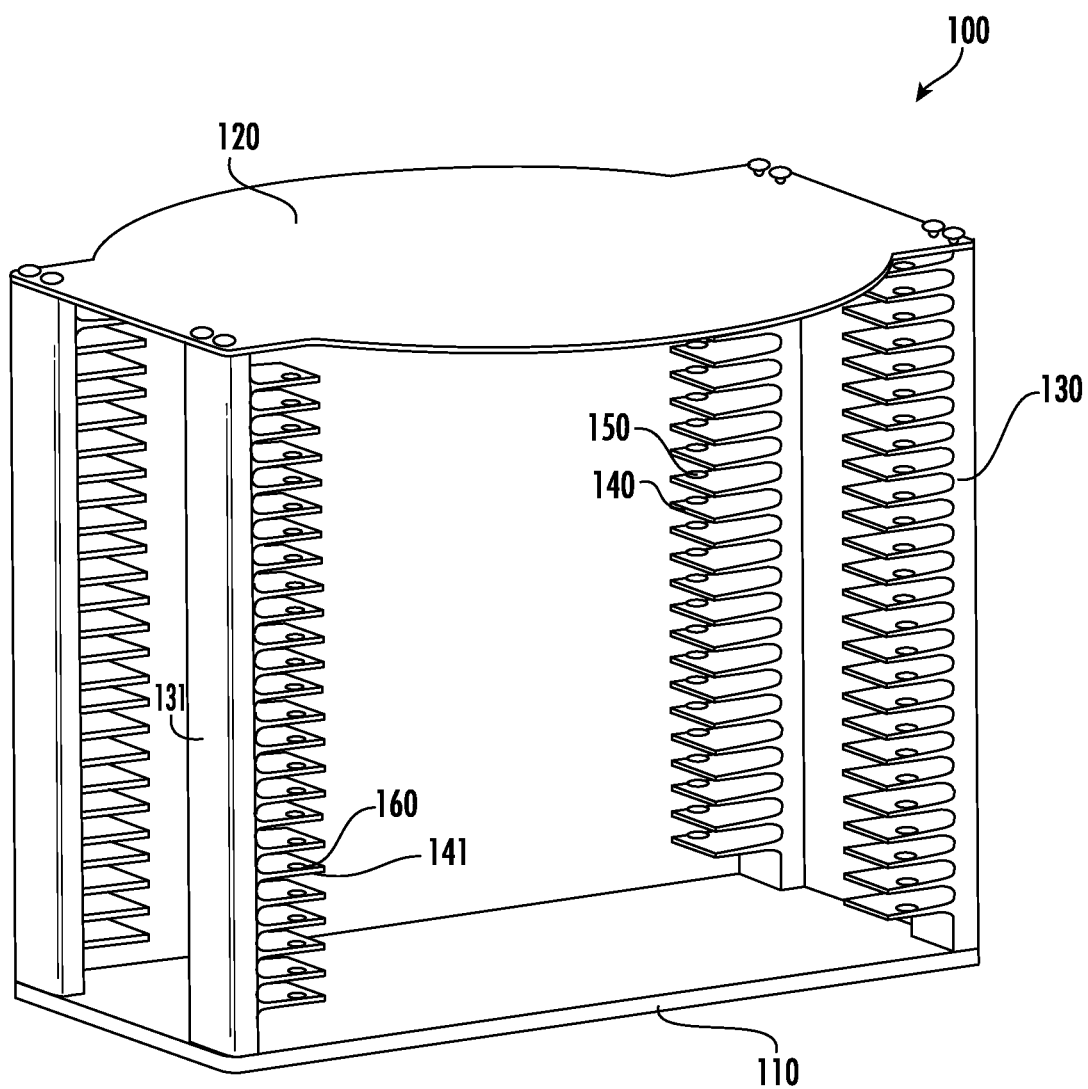
FIG. 1 is load lock cassette according to one embodiment.

FIG. 1 shows a load lock cassette 100 that may be disposed within the load lock. A load lock comprises a chamber, the pressure within which can be regulated and changed. Additionally, in certain embodiments, the load lock may include a mechanism to allow movement, such as an elevator. In other embodiments, the load lock may be fixed in position.

The load lock cassette 100 comprises a bottom wall 110, a top wall 120, and a plurality of posts 130 that extend from the bottom wall 110 to the top wall 120. The bottom wall 110 may have a length of about 13 inches, and a depth of about 6 inches. The posts 130 may be located at the four corners of the bottom wall 110. The posts may be about 11 inches in height. Of course, other dimensions may be used. In certain embodiments, the two posts 130 located on the same end of the bottom wall 110 are separated by about 4 inches. Thus, in this embodiment, there are two posts 130 located near the first end of the bottom wall 110 and two posts 130 located near the second end of the bottom wall 110.

In the embodiment shown in FIG. 1, there are a total of four posts 130; however other numbers of posts may be used. For example, there may be two posts, one located on each end of the bottom wall 110, with shelves that are longer in length to support the workpiece.

Each of the posts 130 may comprise a plurality of shelves 140, which are vertically arranged. Each of the shelves is used to support a single workpiece. The shelves 140 are each small horizontal surfaces which support only a portion of the workpiece. For example, in certain embodiments, each shelf 140 may have dimensions of 1.25 inch×1.25 inch. In other words, each shelf extends inward from its respective post by a distance of about 1.25 inches. Thus, no single shelf can support an entire workpiece; rather, shelves 140 from each post 130 that are vertically aligned with each other are used to support a workpiece. The set of shelves that are vertically aligned with one another may be referred to as a slot.

Each post 130 may have a plurality of shelves, such as between 13 and 26 shelves, defining an equal number of slots, such that a number of workpieces may be disposed in the load lock cassette 100. In this embodiment, each workpiece is supported at four points by vertically aligned shelves from the four different posts 130. In this embodiment, the posts 130 may be disposed at or near the corners of the top wall 120 and the bottom wall 110.

Pads 150 may be disposed on some of the shelves 140 such that the workpiece contacts the pad 150, but does not contact the shelf 140. In certain embodiments, the bottom wall 110, the top wall 120, the shelves 140 and the posts 130 may be constructed of a metal, such as aluminum. Further, in certain embodiments, the post 130 and the shelves 140 comprise a single machined part.

The pads 150 may be made of a durable plastic, such as a polyimide plastic, such as VESPEL®. Thus, over most of its surface, the workpiece is not in physical contact with any support. Only at four locations does the workpiece contact a pad 150. Further, the workpiece is not in physical contact with any other workpiece or any other component within the load lock or the load lock cassette 100.

Figure 2A:
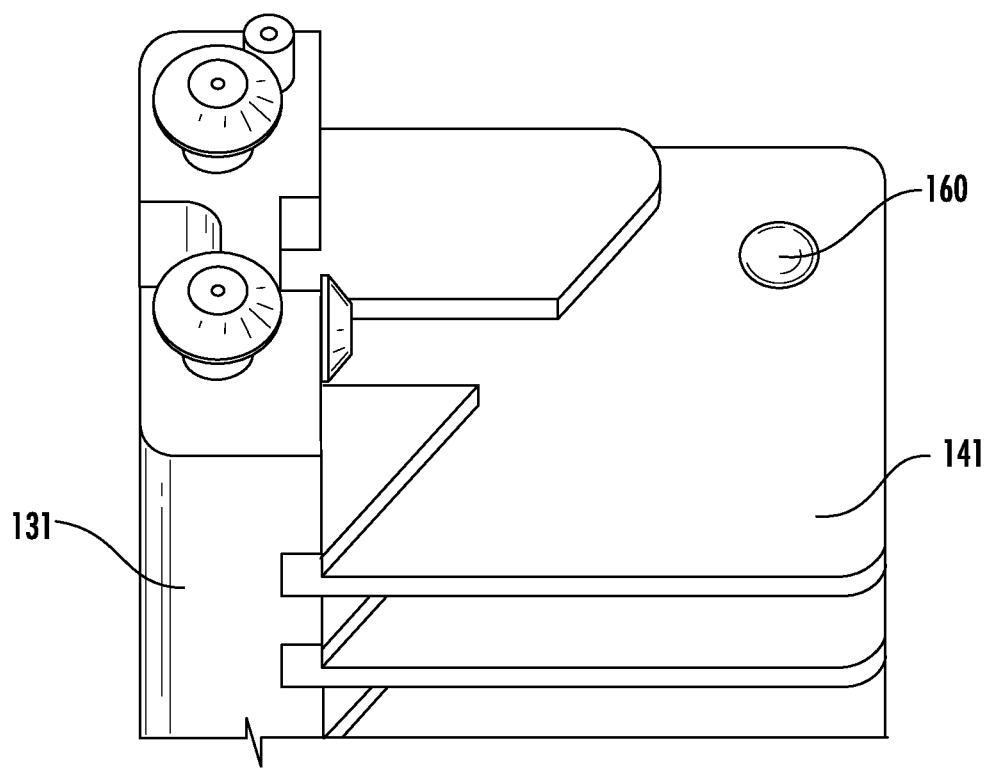
FIG. 2A is a view of a shelf in the load lock cassette with an embedded temperature sensor.
Figure 2B:
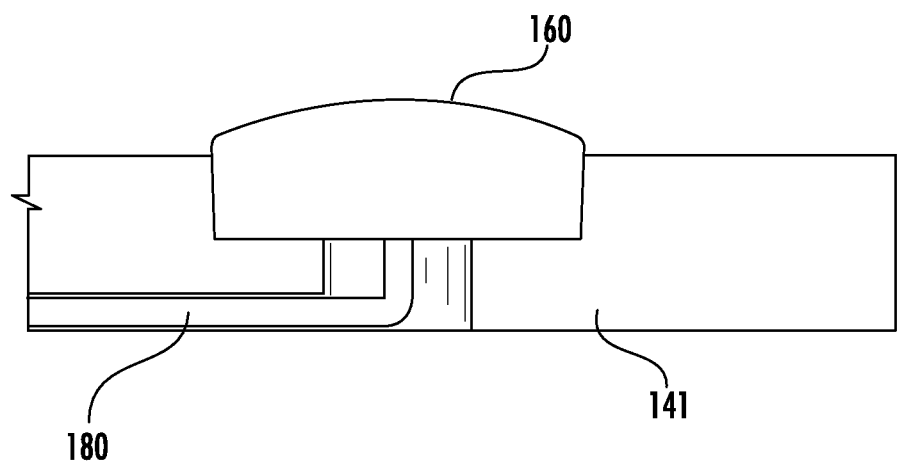
FIG. 2B is a cross-sectional view of the shelf of FIG. 2A.

Some of the shelves 140 may not include a pad 150. Rather, as best shown in FIGS. 2A-2B, in these shelves, the pad 150 has been replaced by a temperature sensor 160. The temperature sensor 160 may be a thermocouple in certain embodiments. These shelves are referred to as sensor shelves 141. The temperature sensor 160 may be disposed in the location typically occupied by the pad 150, such that, when disposed in a slot, the workpiece rests on three pads 150 and one temperature sensor 160. Thus, in certain embodiments, the temperature sensor 160 may be at the same vertical height above the sensor shelf 141 as the pad 150 is above the shelf 140.

In some embodiments, all of the sensor shelves 141 are attached to the same post 130. In this way, the electrical connections that are used for the sensor shelves 141 can be concentrated in or near one of the posts 130. This post may be referred to as the sensor post 131. In one embodiment, each shelf associated with a sensor post 131 is a sensor shelf 141. In other embodiments, fewer than all of the shelves, such as every other shelf, is a sensor shelf 141. In certain embodiments, more than one sensor shelf 141 is employed. Thus, the use of sensor shelves 141 allows the simultaneous measurement of the temperature of a plurality of different workpieces.

To ensure an accurate temperature measurement, the sensor shelf 141 may be constructed of a plastic, such as VESPEL®. The use of plastic sensor shelves serves to thermally and electrically insulate the temperature sensor 160 from the sensor post 131, which may be constructed of a metal, such as aluminum. Thus, unlike the posts 130 and shelves 140, the sensor post 131 and the sensor shelves 141 are not a single part. Further, the sensor post 131 and the sensor shelves 141 may be constructed from different materials.

In certain embodiments, the sensor shelves 141 may be removed from the sensor post 131. FIG. 2B is a cross-sectional view of a sensor shelf 141. As shown in FIG. 2B, the wires 180 from the temperature sensor 160 may be disposed below the associated sensor shelf 141. In one embodiment, the end of the sensor shelf 141 has a small connector that plugs into a mating connector in the sensor post 131. In this embodiment, the sensor post 131 may include a printed circuit board backplane with a plurality of connectors such that the small connector for each sensor shelf 141 plugs into a respective connector in the backplane.

Figure 2C:
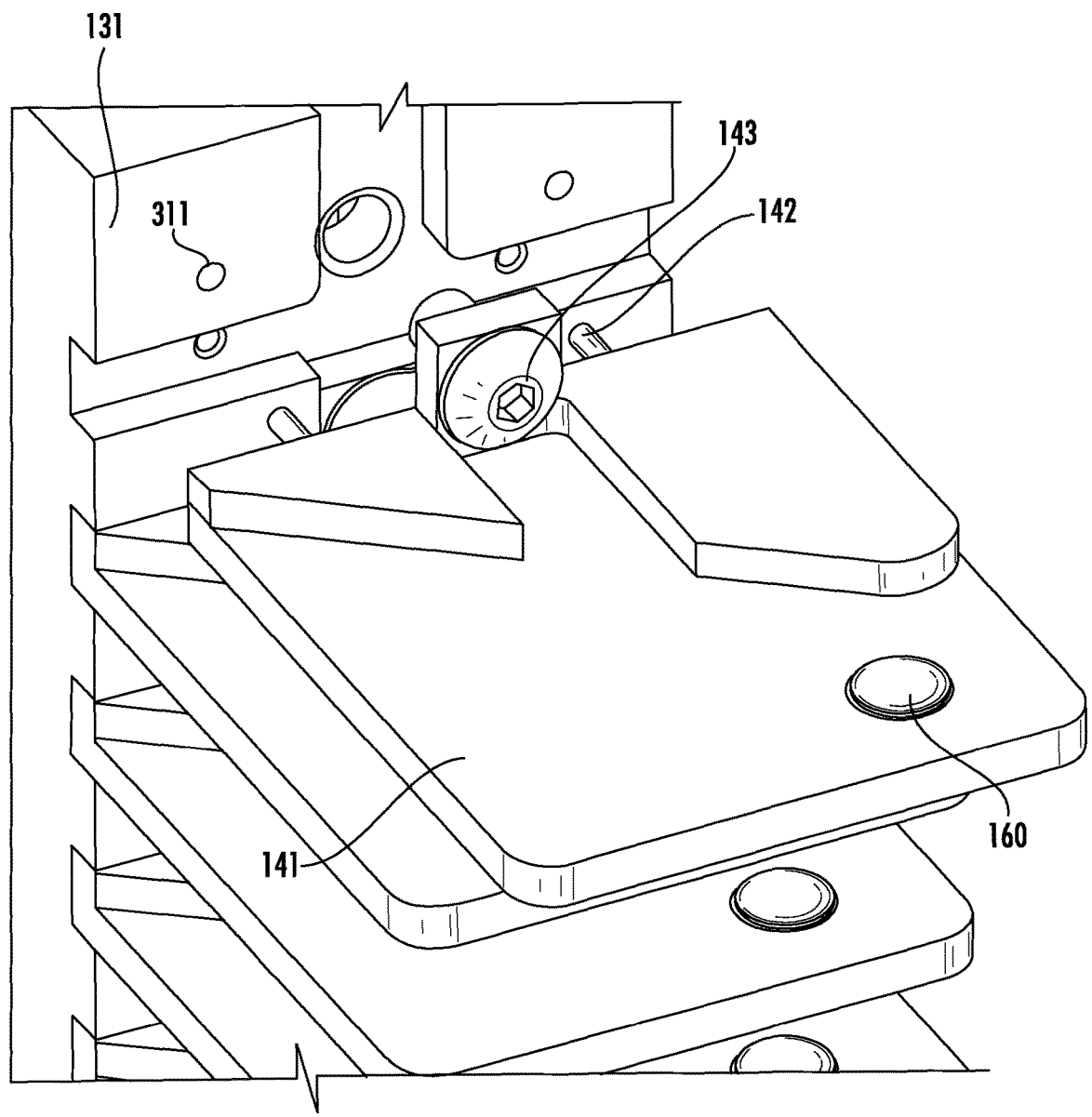
FIG. 2C is another embodiment of the sensor shelf.

In another embodiment, shown in FIG. 2C, the end of the sensor shelf 141 may comprise one or more metal fingers 142 that mate with the sensor post 131. These metal fingers 142 may attach to a printed circuit board backplane, or to a connector. A fastener 143, such as a screw, may be used to attach the sensor shelf 141 to the sensor post 131.

In another embodiment, the wires 180 are routed along an outer surface of the sensor post 131. For example, the wires 180 may be combined to form a wire harness that travels along the outer surface of the sensor post 131.

Figure 3:
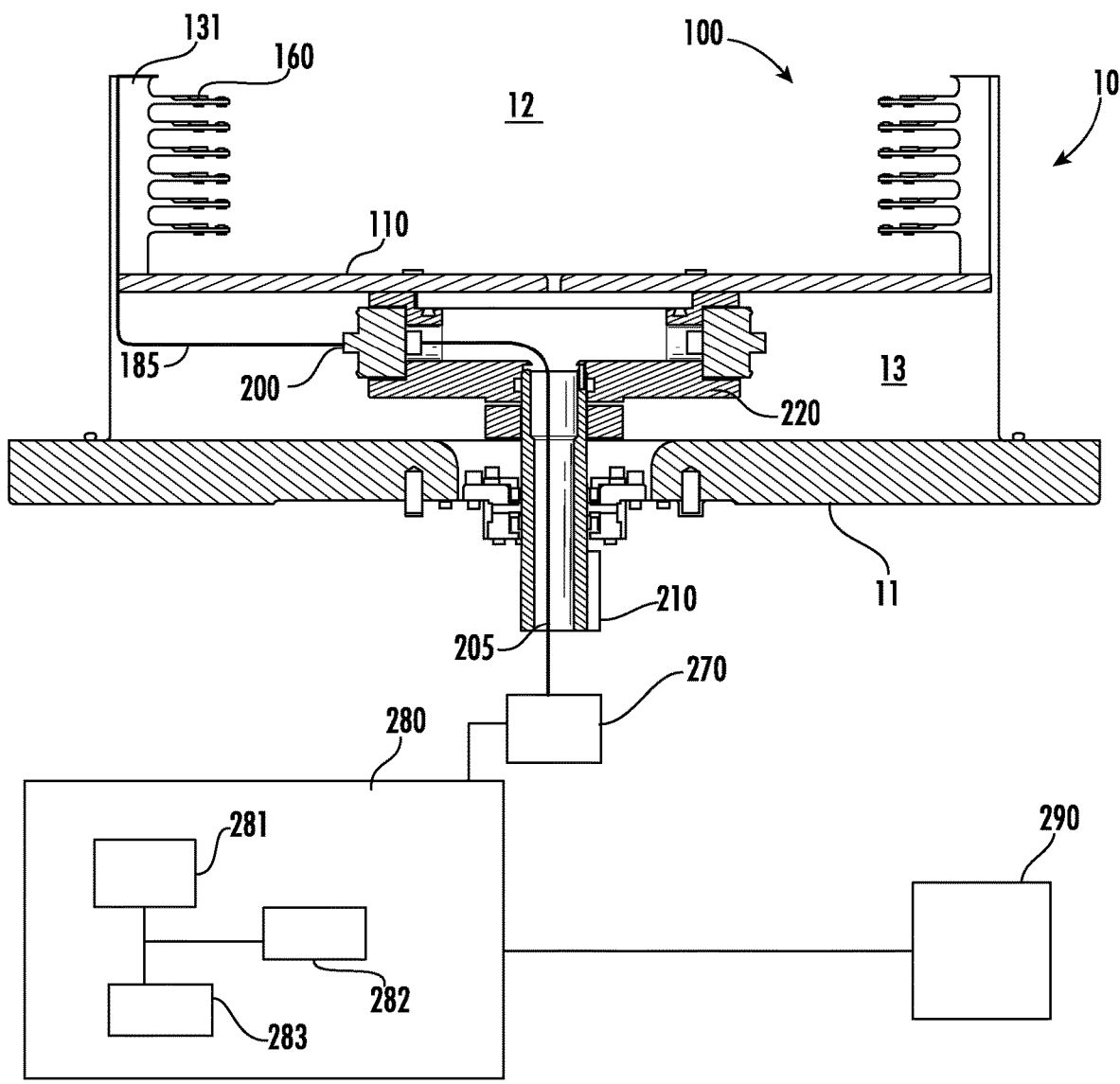
FIG. 3 is a view of the bottom of the load lock and the electrical circuitry.

FIG. 3 shows a cross-section of the lower portion of the load lock 10. The load lock 10 comprises a chamber 12. In this figure, the lower portion of the load lock cassette 100 and the lower portion of the sensor post 131 are shown. The bottom surface 11 of the load lock 10 is also visible. Wires 185, which carry the signals from the temperature sensors 160, may pass through an opening in the bottom wall 110 and enter a region of the chamber 12, referred to as the lower chamber 13. The lower chamber 13 is the part of the chamber 12 that is disposed beneath the load lock cassette 100. This lower chamber 13 is at the same pressure as the chamber 12 of the load lock 10.

The wires 185 from the sensor post 131 then terminate in a connector 200. The connector 200 is disposed in the wall of a load lock support 220. The load lock support 220 is affixed to the bottom side of the bottom wall 110 and may also be in communication with the shaft 210. The shaft 210 may be translated in the vertical direction to allow the load lock support 220 and the load lock cassette 100 to move up or down. In other embodiments, the load lock cassette 100 may be stationary.

The connector 200 may also serve as a vacuum pass through. In other words, the outside of the load lock support 220, which is disposed in the lower chamber 13, is at the same pressure as the chamber 12 of the load lock 10, while the interior of the load lock support 220 is at atmospheric pressure. The wires 205 may then travel though a shaft 210 or other conduit, which also remains at atmospheric pressure.

These wires 205 may then pass through a signal conditioning circuit 270. These signals may then be used by a controller 280. The controller 280 may be implemented in numerous ways, such as with dedicated hardware, or with general purpose hardware, such as a computer system, that is programmed using microcode or software to perform the functions recited herein. Further, the controller 280 may be a mainframe computer, a personal computer, a server or another suitable device. The controller 280 may comprise a processing unit 281 and a local memory device 282. The local memory device 282 may contain instructions, which, when executed by the processing unit 281, enable the controller 280 to perform the functions described herein. This local memory device 282 may be a non-volatile memory, such as a FLASH ROM, an electrically erasable ROM or other suitable devices. In other embodiments, the local memory device 282 may be a volatile memory, such as a RAM or DRAM. Additionally, the controller 280 may include a user input device 283, such as a keyboard, mouse, touch screen or another suitable device. The user input device 283 may be in communication with the processing unit 281.

The controller 280 is also in communication with the actuator 290 that opens and closes the load lock 10.

In operation, at a desired time, the load lock 10 may be opened. In one embodiment, this is done by providing an input to the controller 280, such as via the user input device 283 or an automated process. After all of the workpieces have been placed in the load lock 10, the load lock 10 may be closed. This may be done by providing an input to the controller 280, such as via the user input device 283 or an automated process. Once closed, the load lock 10 is vented to return it to atmospheric pressure. Additionally, the controller 280 may monitor the temperatures of the workpieces within the load lock 10 during the venting process. For example, the controller 280 may sample each of the wires 205 to determine the temperature of each workpiece that is being monitored. In certain embodiments, the controller 280 may then continue monitoring the temperatures until all of the temperature sensors 160 indicate a temperature that is less than a predetermined value. At this time, the controller 280 may open the load lock 10, such as by providing an output to the actuator 290.

In this way, the load lock 10 is opened as soon as all of the workpieces are below a predetermined temperature. Note that the controller 280 is measuring the actual temperature of the workpieces, not the temperature of the air in the load lock 10 or the temperature of the load lock cassette 100.

In addition to monitoring the temperature of the workpieces in the load lock 10, in certain embodiments, the cooling rate of the workpieces in the load lock 10 may also be controlled.

Figure 4:
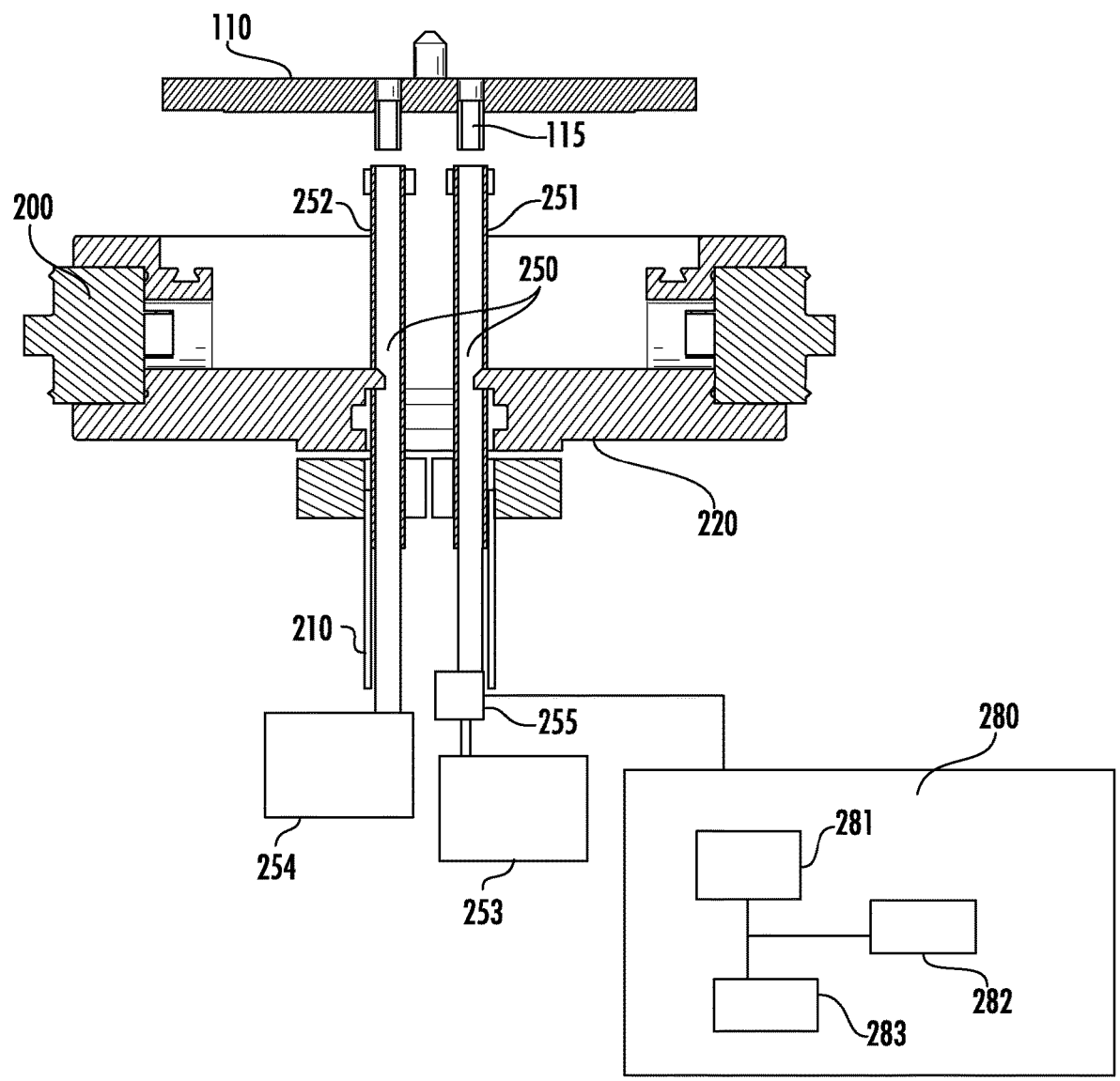
FIG. 4 shows the load lock support and the fluid conduits.

FIG. 4 shows the load lock support 220 that was illustrated in FIG. 3. In this figure, fluid conduits 250 are disposed within the load lock support 220 and the shaft 210. In one embodiment, these fluid conduits 250 pass through the bottom wall 110 of the load lock cassette 100 and into the chamber 12 of the load lock 10. One of the fluid conduits 250 may be the inlet fluid conduit 251, while the other may be the outlet fluid conduit 252.

In another embodiment, short conduits 115 may be disposed or embedded in the bottom wall 110. These short conduits 115 may mate with the fluid conduits 250. For example, these short conduits 115 may be inserted into the fluid conduits 250. The distal end of the inlet fluid conduit 251 may be in fluid communication with a fluid source 253. This fluid source 253 may be a reservoir containing a liquid, such as water. In other embodiments, the fluid source 253 may be a gas, which may be pressurized. This gas may be air or nitrogen. In this way, fluid exits the fluid source 253 and travels to the load lock through the inlet fluid conduit 251. The outlet fluid conduit 252 may be in communication with a fluid sink 254, or a chiller to re-cool the fluid in the outlet fluid conduit 252.

The controller 280 may be in communication with an actuator 255, such as a pump or valve, that allows the flow of fluid from the fluid source 253 to the inlet fluid conduit 251

Figure 5:
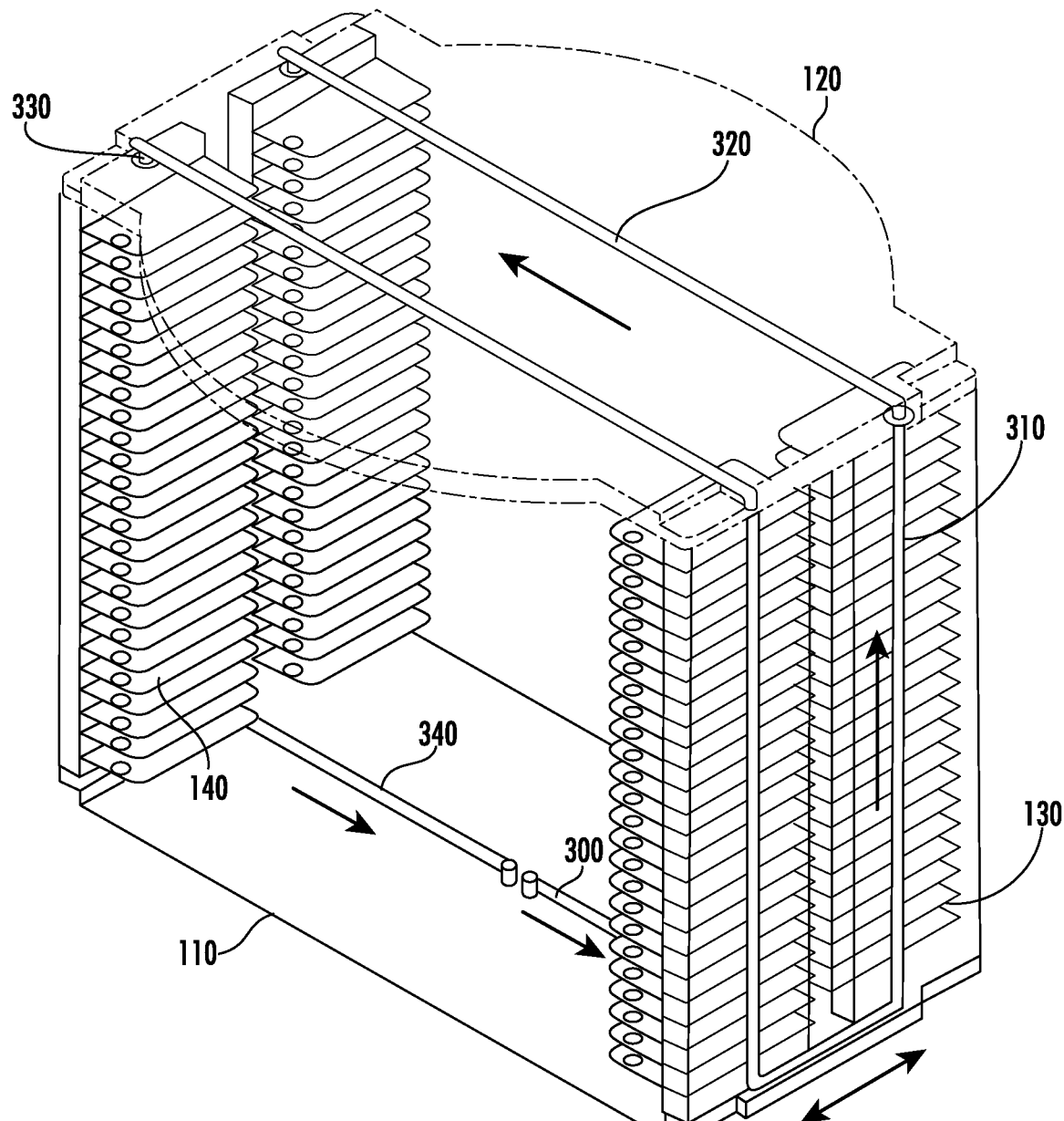
FIG. 5 shows a load lock cassette with integrated cooling channels.

FIG. 5 shows a load lock cassette 100 that incorporates cooling channels according to one embodiment.

In this embodiment, the fluid conduits 250 that pass through the shaft 210 are in communication with cooling channels in the load lock cassette 100. For example, there may be a lower inlet cooling channel 300 that is disposed above the bottom wall 110. Alternatively, the lower inlet cooling channel 300 may be embedded in the bottom wall 110. This lower inlet cooling channel 300 may be in communication with the inlet fluid conduit 251. This lower inlet cooling channel 300 extends to one or more of the posts 130. Vertical inlet cooling channels 310 are in communication with the lower inlet cooling channel 300 and carry the fluid from the bottom wall 110 to the top wall 120. In one embodiment, the vertical inlet cooling channels 310 are disposed within one or more posts 130 or sensor posts 131. In this way, the fluid serves to cool the post 130 and its associated shelves 140. Similarly, if the vertical inlet cooling channels 310 are disposed the sensor post 131, the fluid serves to cool the sensor post 131 and its associated sensor shelves 141. Thus, if there are multiple posts 130 or sensor posts 131 on one end of the load lock cassette 100, there may be multiple vertical inlet cooling channels 310.

The vertical inlet cooling channels 310 are in communication with an upper cooling channel 320. The upper cooling channel 320 may be disposed proximate to or embedded within the top wall 120. The opposite end of the upper cooling channel 320 is in communication with one or more vertical outlet cooling channels 330. These vertical outlet cooling channels 330 are disposed within one or more posts 130 or sensor posts 131. In this way, the fluid serves to cool the post 130 and its associated shelves 140. Similarly, if the vertical outlet cooling channels 330 are disposed in the sensor post 131, the fluid serves to cool the sensor post 131 and its associated sensor shelves 141. The vertical outlet cooling channels 330 may be in communication with a lower outlet cooling channel 340. The lower outlet cooling channel 340 may be disposed above the bottom wall 110. Alternatively, the lower outlet cooling channel 340 may be embedded in the bottom wall 110. The lower outlet cooling channel 340 is in communication with the outlet fluid conduit 252, completing the loop.

In this embodiment, vertical inlet cooling channels are disposed on one end and vertical outlet cooling channels are disposed on the opposite end of the load lock cassette. Of course, other embodiments are also possible.

Figure 6:
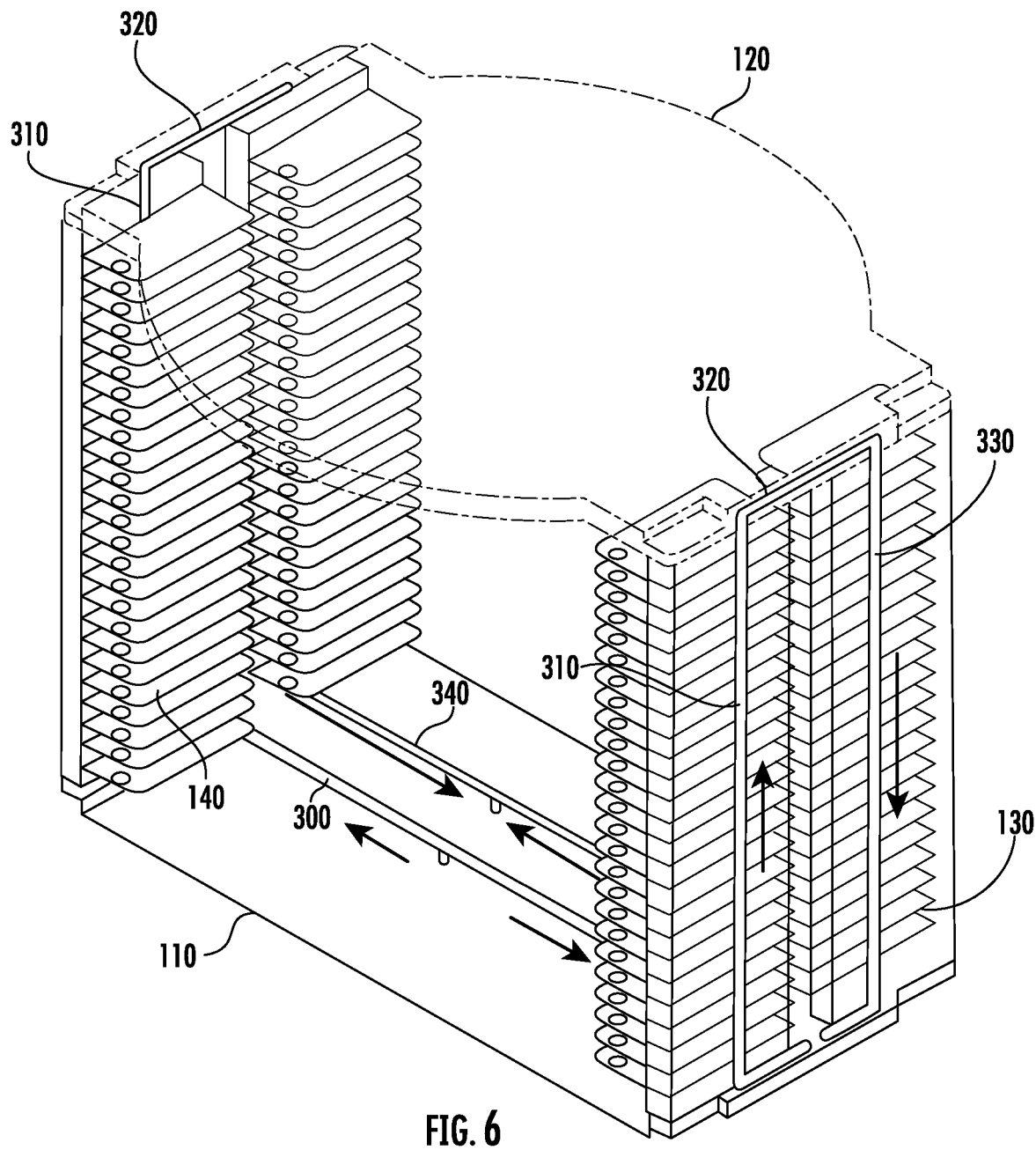
FIG. 6 shows a load lock cassette with integrated cooling channels according to another embodiment.

For example, as shown in FIG. 6, the vertical inlet cooling channels 310 and the vertical outlet cooling channels 330 may both be disposed on both ends of the load lock cassette 100. For example, if there are two posts 130 (or a post 130 and a sensor post 131) on each end of the load lock cassette 100, the vertical inlet cooling channel 310 may travel up a first post of these two posts. The upper cooling channel 320, rather than traveling across the top wall 120 of the load lock cassette, may travel between the first and second posts disposed at the same end of the load lock cassette 100. Thus, there are two upper cooling channels 320 in this embodiment. Additionally, the lower inlet cooling channel 300 may be in communication with vertical inlet cooling channels 310 disposed on both ends of the load lock cassette 100. Similarly, the lower outlet cooling channel 340 may be in communication with vertical outlet cooling channels 330 disposed on both ends of the load lock cassette 100.

Additionally, other embodiments are also possible. For example, FIGS. 5 and 6 include closed systems, where the fluid travels from a fluid source to a fluid sink. However, in other embodiments, there may only be a fluid source.

Figure 7:
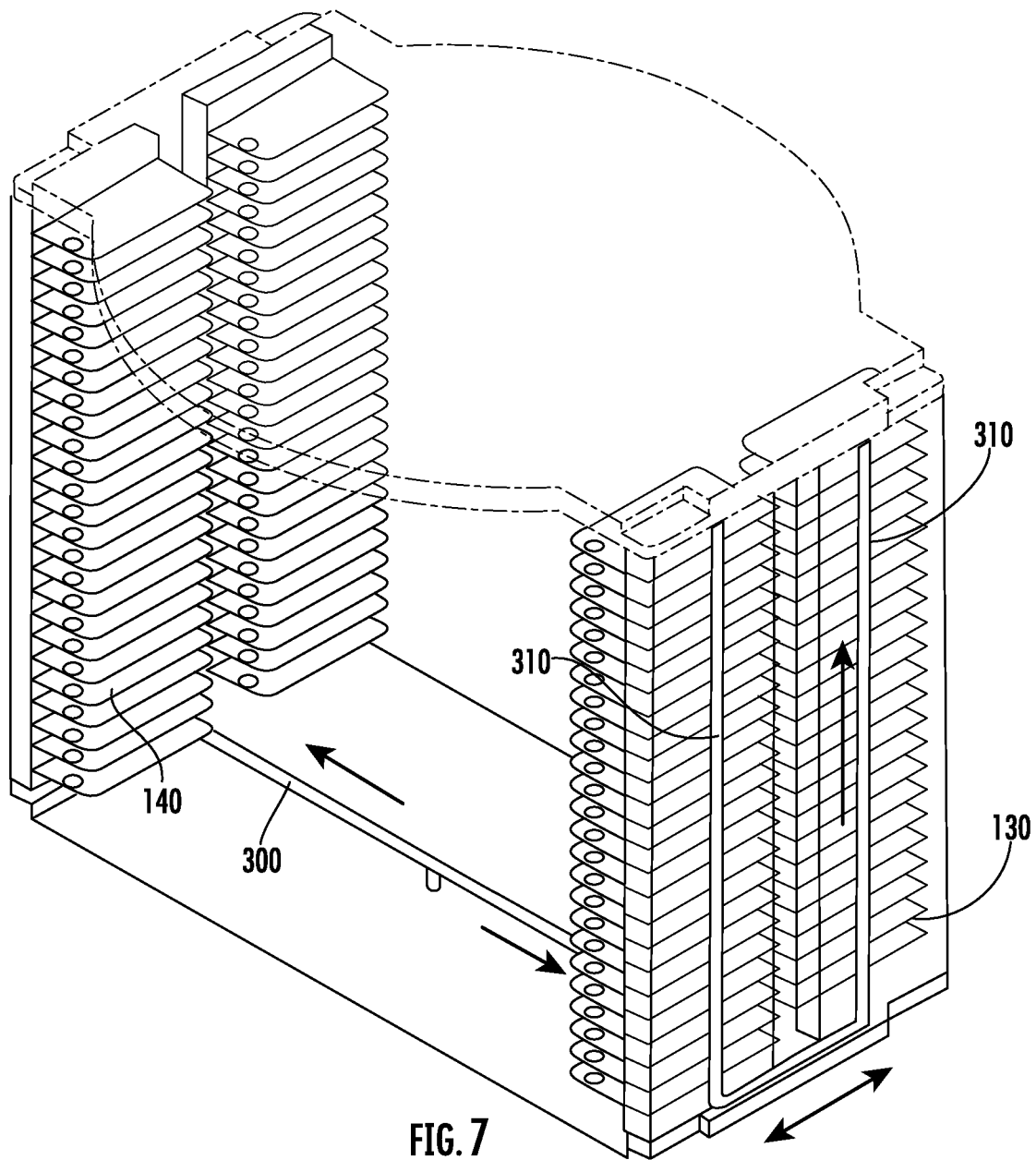
FIG. 7 shows a load lock cassette with integrated cooling channels according to another embodiment.

For example, if the fluid is a gas, such as nitrogen, the fluid may exit into the chamber 12. For example, as shown in FIG. 7, the lower inlet cooling channel 300 may be in communication with vertical inlet cooling channels 310 disposed on both ends of the load lock cassette 100. The vertical inlet cooling channels 310 may comprise a plurality of nozzles 311 or openings (see FIG. 2C) that are disposed on the interior surface of the post 130 or the sensor post 131. Thus, as gas travels through the vertical inlet cooling channels 310, it is expelled through the nozzles 311 or openings into chamber 12 proximate the workpieces.

The controller 280 may perform closed loop control of the cooling of the workpieces. Specifically, the controller 280 may monitor the output of each temperature sensor 160. As long as the temperature of at least one of the temperature sensors 160 is greater than a predetermined value, the controller 280 will enable the actuator 255 to circulate cooling fluid. Once the highest temperature measured by any of the temperature sensors 160 is less than the predetermined value, the controller 280 may disable the flow of cooling fluid. In certain embodiments, the controller 280 may perform a controlled cooling rate profile so that the cooling of the workpieces follows a predetermined temperature profile.

Additionally, while the disclosure above describes the use of wire harnesses, other embodiments are also possible. For example, in one embodiment, the sensor shelves 141 may comprise wireless transmitters to wirelessly transmit data to the controller 280. In this embodiment, the wires 185, 205 may be eliminated. In another embodiment, a serial interface is provided to each sensor shelf 141. For example, Serial Peripheral Interface (SPI), Inter-Integrated Circuit (I2C) or another multi-wire serial protocol may be used to transmit temperature information from each sensor shelf 141 to the controller 280.

The embodiments described above in the present application may have many advantages. First, in the present load lock cassette 100, the workpieces each may have minimal physical contact with other structures within the load lock. Consequently, the amount of thermal conduction is limited. Thus, each workpiece may cool at a rate that is relatively unique and unrelated to the cooling rate of another workpiece. Secondly, the workpieces are returned to the load lock cassette at different times. Therefore, their cooling profiles will also vary as a function of time.

Figure 8:
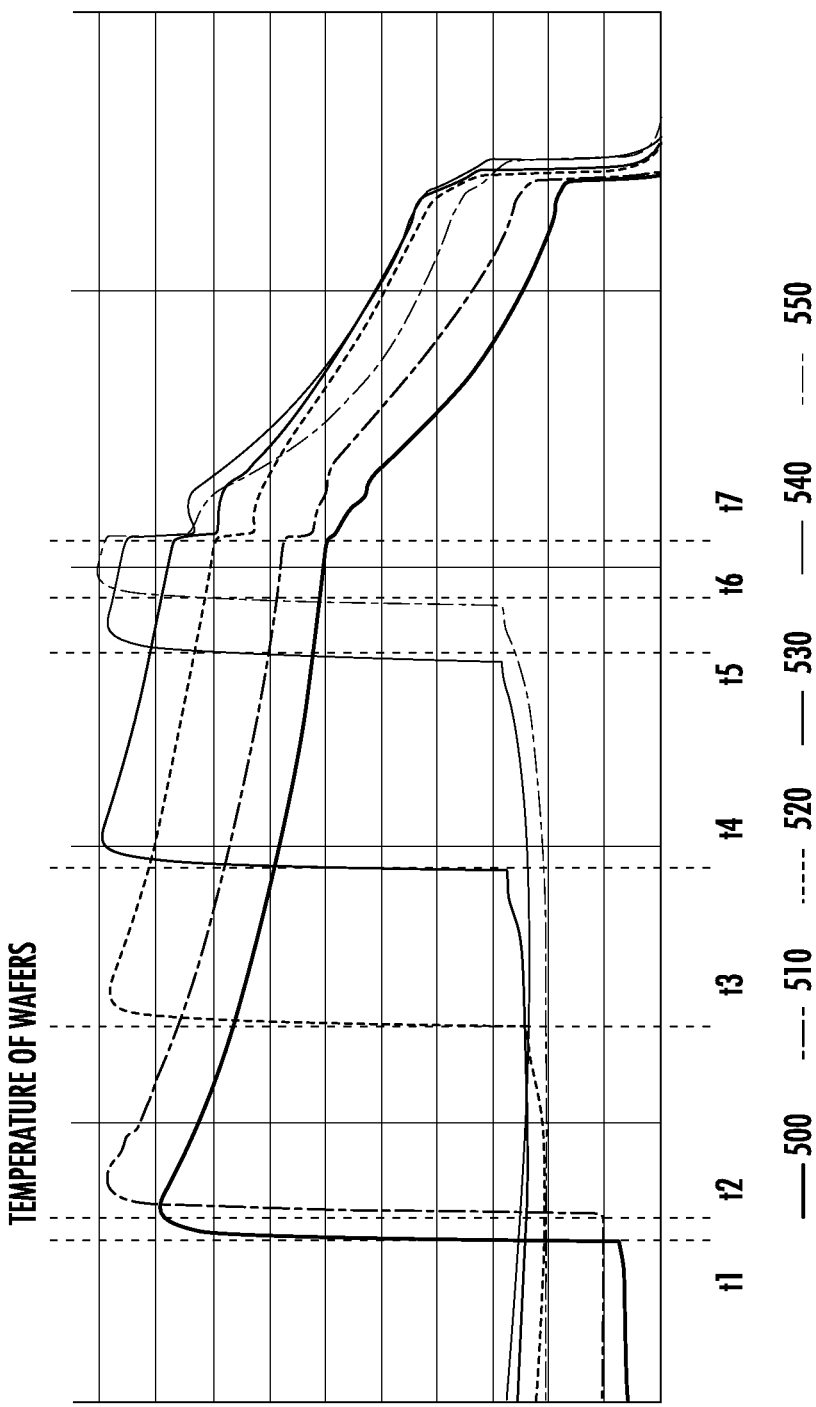
FIG. 8 is an example showing the temperature of various workpieces as a function of time.

Thus, the ability to individually monitor the temperature of each workpiece allows control not previously possible. For example, FIG. 8 shows the results of an actual test. In this test, six workpieces 500, 510, 520, 530, 540, 550 are returned to the load lock cassette 100 after being processed at an elevated temperature. Each is returned to a different slot, where a slot is defined by a set of shelves 140 and sensor shelves 141 that support one workpiece.

First, workpiece 500 is returned to a slot at time t1. At that time, the workpiece 500 has already cooled somewhat and continues to cool. At time t2, workpiece 510 is returned to a slot in the load lock cassette 100. As expected, workpiece 510 has a higher temperature at time t2 than workpiece 500, as it was more recently processed. At time t3, workpiece 520 is returned to a slot in the load lock cassette 100. Workpieces 530, 540, 550 are returned to the load lock cassette 100 at times t4, t5 and t6, respectively. At time t7, the load lock 10 is vented, introducing air into the chamber. Note that the cooling rate of each workpiece after venting begins is not constant. In fact, workpiece 550, which was returned to the load lock cassette last, cools faster than workpieces 520, 530 and 540. Unexpectedly, workpiece 520, which was the third workpiece to be returned to the load lock cassette 100, remains the warmest after venting begins. Without being bound to any particular theory, it is believed that the placement of each workpiece in the load lock cassette 100 influences its cooling rate. In other words, monitoring only the last workpiece that was returned may not provide a true indication of the maximum temperature within the load lock cassette. Rather, it appears that slot assignment and time of introduction are both factors in determining the cooling rate. For example, the radiant cooling of each slot, as well as the air flow across the workpiece in each slot, differs. Further, the initial temperature of the workpieces, the composition of the workpieces, and other factors may influence the cooling rate of each slot.

By directly measuring each workpiece, or at least a plurality of workpieces, it is possible to much more accurately determine when it is safe to open the load lock. This level of precision is simply not possible by remotely monitoring the air temperature within the load lock, or the temperature of one of the surfaces within the load lock.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system comprising:
   a load lock;
   a load lock cassette disposed in the load lock, the load lock cassette comprising:
   a bottom wall having a first end and a second end;
   a top wall;
   a sensor post extending upward from the first end of the bottom wall to the top wall, wherein the sensor post comprises a plurality of sensor shelves, wherein each sensor shelf comprises a temperature sensor, adapted to physically contact a workpiece;
   a post extending upward from the second end of the bottom wall; and
   cooling channels disposed in the bottom wall, the top wall, the post and the sensor post in a closed system; and
   a controller, in communication with each of the temperature sensors, wherein the controller is configured to monitor each temperature sensor and uses data from the temperature sensors to control a flow of fluid through the cooling channels so that the cooling of workpieces follows a predetermined temperature profile.

2. The load lock cassette of claim 1, wherein the post and the sensor post each comprises a vertical cooling channel disposed therein.

3. The load lock cassette of claim 2, further comprising a lower inlet cooling channel in communication with the vertical cooling channel in the sensor post disposed at the first end of the bottom wall, wherein the lower inlet cooling channel is disposed proximate to or embedded in the bottom wall.

4. The load lock cassette of claim 3, further comprising a lower outlet cooling channel in communication with the vertical cooling channel in the post disposed at the second end of the bottom wall, wherein the lower outlet cooling channel is disposed proximate to or embedded in the bottom wall.

5. The load lock cassette of claim 4, further comprising an upper cooling channel in communication with each of the vertical cooling channels, wherein the upper cooling channel is disposed proximate to or embedded in the top wall.

6. The load lock cassette of claim 2, wherein the load lock cassette further comprises an additional post extending upward from the first end of the bottom wall and an additional post extending upward from the second end of the bottom wall, and further comprising a lower inlet cooling channel in communication with the vertical cooling channel disposed in the sensor post disposed at the first end of the bottom wall and in communication with the vertical cooling channel disposed in a first post disposed at the second end of the bottom wall, wherein the lower inlet cooling channel is disposed proximate to or embedded in the bottom wall.

7. The load lock cassette of claim 6, further comprising a lower outlet cooling channel in communication with the vertical cooling channel disposed in the additional post disposed at the first end of the bottom wall and in communication with the vertical cooling channel disposed in a second post disposed at the second end of the bottom wall, wherein the lower outlet cooling channel is disposed proximate to or embedded in the bottom wall.

8. The load lock cassette of claim 7, further comprising a first upper cooling channel in communication with the vertical cooling channel disposed in the sensor post and the vertical cooling channel disposed in the additional post disposed at the first end and a second upper cooling channel in communication with the vertical cooling channel disposed in the first post and the vertical cooling channel disposed in the second post disposed at the second end, wherein the first upper cooling channel and the second upper cooling channel are disposed proximate to or embedded in the top wall.

9. The load lock cassette of claim 1, wherein the sensor post comprises a printed circuit backplane.

10. The system of claim 1, wherein the controller opens the load lock when all of the temperature sensors indicate a temperature less than a predetermined value.

11. The system of claim 1, wherein the sensor shelves are made using a plastic material and are removable from the sensor post.

12. The system of claim 11, where the sensor post is made from a metal.

13. A system, comprising:
   a load lock;
   a load lock cassette disposed in the load lock, the load lock cassette comprising:
      a bottom wall having a first end and a second end;
      a top wall; and
      a sensor post extending upward from the first end of the bottom wall to the top wall, wherein the sensor post comprises a plurality of sensor shelves, wherein each sensor shelf comprises a temperature sensor, adapted to physically contact a workpiece;
      a post extending upward from the second end of the bottom wall, wherein the post comprises a plurality of shelves, wherein the workpiece is supported by one of the plurality of shelves and one of the plurality of sensor shelves which is vertically aligned with the one of the plurality of sensor shelves;
   a controller, in communication with each of the temperature sensors, wherein the controller is configured to monitor each temperature sensor;
   a fluid source; and
   an actuator to control a flow of fluid from the fluid source;
   wherein cooling channels are disposed in the sensor post and the post, and wherein the controller uses data from the temperature sensors to control the actuator to allow the flow of fluid from the fluid source through the cooling channels so that the cooling of workpieces follows a predetermined temperature profile.

14. The system of claim 13, further comprising upper cooling channels disposed in the top wall, wherein the fluid flows through the top wall.

15. The system of claim 13, wherein the fluid is a gas and the cooling channels comprise nozzles or openings on an interior surface of the post, such that the gas flows across the workpiece disposed on a shelf on the post.

* * * * *